United States Patent
Kim et al.

(10) Patent No.: US 9,275,876 B2
(45) Date of Patent: Mar. 1, 2016

(54) STIFFENER WITH EMBEDDED PASSIVE COMPONENTS

(71) Applicant: QUALCOMM Incorporated, San Diego, CA (US)

(72) Inventors: Dong Wook Kim, San Diego, CA (US); Kyu-Pyung Hwang, San Diego, CA (US); Young Kyu Song, San Diego, CA (US); Changhan Hobie Yun, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/042,140

(22) Filed: Sep. 30, 2013

(65) Prior Publication Data
US 2015/0091132 A1 Apr. 2, 2015

(51) Int. Cl.
| | |
|---|---|
| *H01L 21/00* | (2006.01) |
| *H01L 21/52* | (2006.01) |
| *H01L 21/48* | (2006.01) |
| *H01L 23/13* | (2006.01) |
| *H01L 49/02* | (2006.01) |
| *H01L 23/16* | (2006.01) |
| *H01L 23/04* | (2006.01) |

(52) U.S. Cl.
CPC ............ *H01L 21/52* (2013.01); *H01L 21/4817* (2013.01); *H01L 23/13* (2013.01); *H01L 23/16* (2013.01); *H01L 28/60* (2013.01); *H01L 23/04* (2013.01); *H01L 2924/0002* (2013.01)

(58) Field of Classification Search
USPC .......... 438/125, 106, 121, 171, 393; 257/528, 257/532
See application file for complete search history.

(56) References Cited

U.S. PATENT DOCUMENTS

| | | | |
|---|---|---|---|
| 6,184,589 B1 | 2/2001 | Budnaitis et al. | |
| 6,570,250 B1 | 5/2003 | Pommer | |
| 6,806,563 B2 | 10/2004 | Libous et al. | |
| 7,586,188 B2 | 9/2009 | Chang | |
| 7,898,093 B1 * | 3/2011 | Darveaux et al. | 257/787 |
| 8,143,721 B2 * | 3/2012 | Ongchin et al. | 257/729 |

(Continued)

FOREIGN PATENT DOCUMENTS

| | | |
|---|---|---|
| EP | 2278615 A2 | 1/2011 |
| WO | 2008026077 A2 | 3/2008 |

OTHER PUBLICATIONS

International Search Report and Written Opinion—PCT/US2014/057584—ISA/EPO—Jan. 28, 2015.

*Primary Examiner* — Timor Karimy
(74) *Attorney, Agent, or Firm* — Muncy, Geissler, Olds & Lowe, P.C.

(57) ABSTRACT

Systems and methods for preventing warpage of a semiconductor substrate in a semiconductor package. A continuous or uninterrupted stiffener structure is designed with a recessed groove, such that passive components, such as, high density capacitors are housed within the recessed groove. The stiffener structure with the recessed groove is attached to the semiconductor substrate using anisotropic conductive film (ACF) or anisotropic conductive paste (ACP). The stiffener structure with the recessed groove surrounds one or more semiconductor devices that may be formed on the semiconductor substrate. The stiffener structure with the recessed groove does not extend beyond horizontal boundaries of the semiconductor substrate.

22 Claims, 5 Drawing Sheets

(56) References Cited

U.S. PATENT DOCUMENTS

| | | |
|---|---|---|
| 2005/0047094 A1 | 3/2005 | Hsu et al. |
| 2008/0197477 A1 * | 8/2008 | McLellan et al. ............. 257/690 |
| 2008/0284047 A1 | 11/2008 | Tosaya et al. |
| 2009/0200659 A1 | 8/2009 | Tosaya et al. |
| 2013/0001740 A1 | 1/2013 | Ma |
| 2013/0098667 A1 | 4/2013 | Ryu et al. |

* cited by examiner

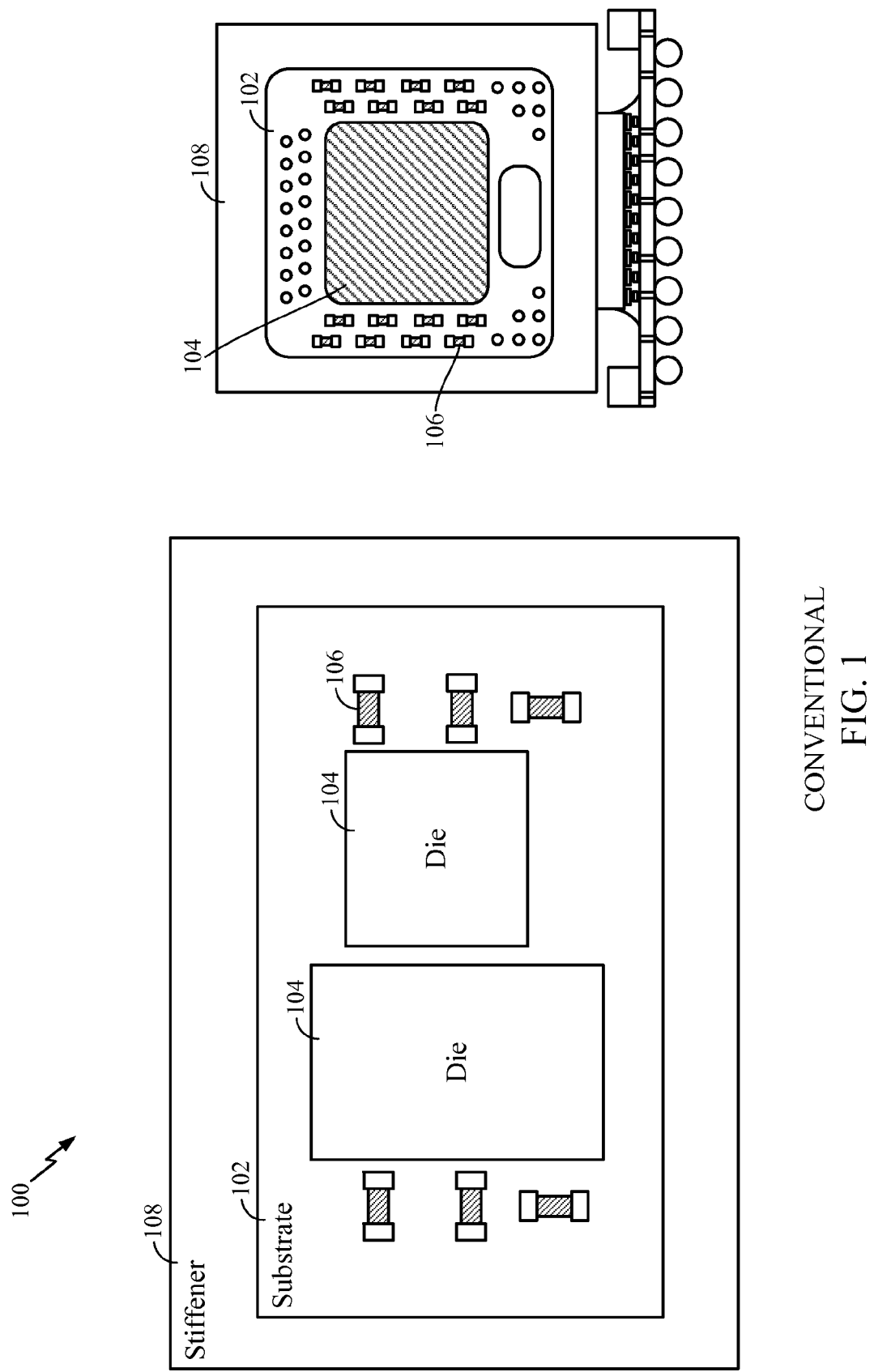
CONVENTIONAL
FIG. 1

STIFFENER WITH EMBEDDED PASSIVE COMPONENTS

FIELD OF DISCLOSURE

Disclosed embodiments are directed to semiconductor package structures comprising stiffeners designed to reduce warpage. More specifically, some embodiments are directed to continuous or uninterrupted stiffener structures designed with a recessed groove, the recessed groove designed to accept high density capacitors and/or other passive components, the recessed groove forming an outer ring around one or more semiconductor dies of the package.

BACKGROUND

Conventional semiconductor device packages comprise an integrated circuit or chip or die mounted on a substrate. Typically, the die is mounted on the substrate and interconnections are formed by wire bond and/or flip chip techniques as known in the art. In either case, the die does not cover the entire surface area of the substrate. Additional components such as decoupling capacitors or other passive circuit elements are also usually included within the package, typically on the substrate area surrounding the die, in order to reduce noise and high frequency transients on the die, for example. A stiffener is used to provide stability to the package elements, and prevent warpage due to thermal expansion.

Conventionally, the stiffener is mounted on the substrate using surface mount technology (SMT). Stiffeners can be made from metals such as Copper or Aluminum or a ceramic material. The coefficient of thermal expansion (CTE) of the stiffeners can be made to match that of the substrate in order to provide mechanical support and prevent warpage.

A schematic top view as well as a pictorial depiction of conventional package 100 is illustrated in FIG. 1. One or more dies, collectively depicted as die 104, is mounted on substrate 102. Substrate 102 may include passives 106 in an outer perimeter around die 104. Passive 106 and other components may be mounted on substrate 102 using SMT. Stiffener 108 surrounds substrate 102 in an outer ring. A horizontal portion of stiffener 108 overlaps the surface of substrate 102 and a substantial horizontal area of stiffener 108 lies outside the horizontal surface area of substrate 102 in order to provide mechanical stability. Stiffener 108 may also be attached or mounted on substrate 102 using SMT.

The structure of conventional package 100 suffers from many drawbacks. Stiffener 108 has a large horizontal area or thickness which extends beyond the horizontal area of substrate 102 in order to satisfy the requirements of protecting the package components (sometimes greater than 0.5 mm). This increases the overall footprint or horizontal surface area of the package. However, advancements in technology place demands on significant reduction in the size and area of packages, which in turn imposes a restriction on useful package area, i.e., package area not consumed by the stiffener. High end surface mount packaging, such as, the well-known flip chip ball grid array (fcBGA) are further seen to require smaller package thickness in order to maintain a thin package profile. Such technologies are seen suffer from the limitation on package components which can be included and also rising package thicknesses, owing to the conventional stiffener structures which are currently used.

Some conventional approaches attempt to overcome the above limitations by creating holes in the surface-mounted stiffener material in order to create room for integration of passive components in these holes. However, these holes disrupt continuity of the stiffener, which reduces the stiffener's effectiveness in providing mechanical stability and preventing warpage. Moreover, electrical connections to these passives formed within the holes in the stiffener, or other conventional placements of the passive components (e.g., passives 106) require careful and meticulous planning because of their scattered placement on the substrate, with a view to maximizing available surface area on the substrate. This also affects the power distribution network (PDN) design for the package, as expensive and often difficult wiring paths need to be created to accommodate such placement of the passives.

Accordingly, there is a need for overcoming the aforementioned problems associated with conventional stiffener structures, in order to achieve high quality stiffener structures which do not negatively impact the package sizes.

SUMMARY

Exemplary embodiments are directed to systems and methods for preventing warpage of semiconductor substrates in semiconductor packages. Accordingly, one or more embodiments are directed to continuous or uninterrupted stiffener structures designed with a recessed groove, the recessed groove designed to accept high density capacitors and/or other passive components, the recessed groove forming an outer ring around one or more semiconductor dies of the package.

For example, an exemplary embodiment is directed to a method of forming a stiffener for a semiconductor package, the method comprising: forming a recessed groove in a stiffener, embedding a passive component within the recessed groove, and attaching the stiffener with the embedded passive component to a first surface of a substrate.

Another exemplary embodiment is directed to a semiconductor package comprising: a substrate, a stiffener attached to a first surface of the substrate, wherein the stiffener comprises a recessed groove, and a passive component embedded within the recessed groove Yet another exemplary embodiment is directed to a semiconductor package system comprising: a substrate, a stiffener attached to a first surface of the substrate, the stiffener comprising a means for receiving, and a passive component embedded within the means for receiving.

BRIEF DESCRIPTION OF THE DRAWINGS

The accompanying drawings are presented to aid in the description of embodiments of the invention and are provided solely for illustration of the embodiments and not limitation thereof.

FIG. 1 illustrates top and side views of a conventional package structure with stiffener.

DETAILED DESCRIPTION

Figure 2A:
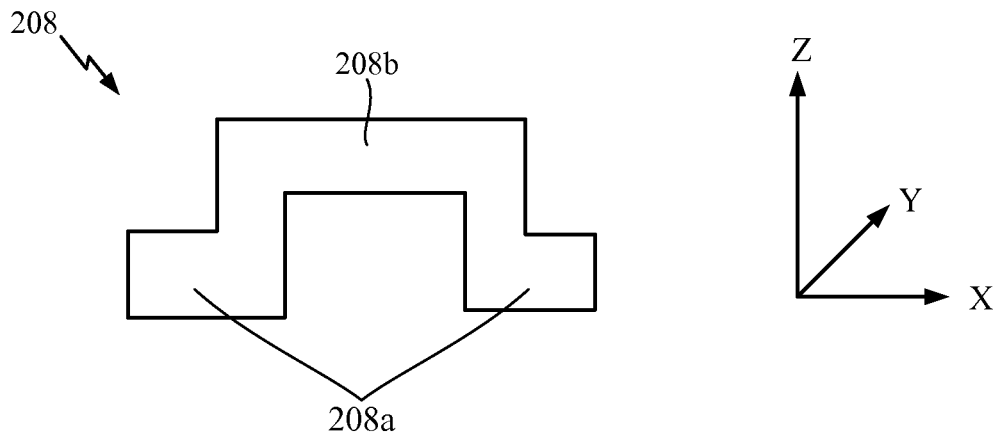
FIGS. 2A-B illustrate side and top views, respectively, of an exemplary stiffener structure with a recessed groove.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary embodiments are directed to novel stiffener structures designed to overcome the numerous drawbacks of conventional stiffeners. In this disclosure, it is recognized that the effectiveness or quality of a stiffener depends on aspects such as, the surface area of the stiffener, method of attachment to the substrate, contact area with the substrate, and the material used for the stiffener.

In order to provide improved attachment area (or contact area), but also prevent the overall package size from improving, exemplary stiffeners are formed such that the horizontal surface area of the exemplary stiffeners are contained or at least limited by horizontal outer edges or boundaries of the substrate. Exemplary stiffeners are attached to the substrate using anisotropic conductive film (ACF) or anisotropic conductive paste (ACP). As such, this overcomes previously discussed drawbacks of conventional stiffener 108 mounted on substrate 102 using SMT.

Moreover, exemplary stiffeners are designed with a recessed groove, such that the stiffener is formed of an uninterrupted layer or continuous material, without holes or other disruptions in the stiffener's continuity that may be known in the art. In some cases, the recessed groove can be designed to resemble an outer ring around one or more semiconductor dies attached to or mounted on the substrate. Passive components can be housed within the recessed groove in a regular and well-defined placement offered by the recessed groove. Wire connections and PDN planning can be simplified to passive components located within the groove. Because there are no interruptions or holes in the exemplary stiffeners, the integrity or effectiveness of the stiffeners in providing mechanical support and preventing warpage are not compromised. The size of the groove can be carefully designed in advance based on the size of passive components to be housed within the grooves. The placement of the passives on the substrate, as well as design of the PDN can also be planned in advance of attachment of the stiffener to the substrate. The above and other advantageous aspects are enabled by the novel stiffener structures, which will be discussed below with reference to exemplary embodiments and related figures.

Firstly, with reference to FIG. 2A, a side view of a basic embodiment related to an exemplary stiffener in a semiconductor package or semiconductor package system is illustrated. Specifically, a schematic diagram of a vertical slice of stiffener 208 is shown in this depiction. Stiffener 208 has a means for receiving one or more components or a recessed groove. More specifically, stiffener 208 comprises two portions, depicted as groove 208b and body 208a. As used herein, the term, "body" or "body portion" with regard to body 208a of stiffener 208 relates to the portion of stiffener 208 outside of groove 208b, which will be attached to a substrate (not shown in this view), and the term "groove" or "groove portion" relates to a recessed groove or housing which provides a receptacle or means for receiving, which can receive components, such as, high density capacitors or other passive components. In FIG. 2A, body 208a extends in the horizontal (X and Y) direction to cover a desired area of the surface of the substrate. If the substrate is considered to be underneath body 208a, a top portion of groove 208b is on a plane above the plane comprising body 208a, with side portions of groove 208b in contact with body 208a. It will be understood that, terms such as "top," "bottom," "above," "below," "underneath," "side," etc., are used herein for illustrative purposes only, and not intended as a limitation. For example, the described embodiments can be easily applicable to substrate 202 disposed on a first plane, body 208a of stiffener 208 attached to a first surface of substrate 202 and a first portion of groove 208b on a second plane separated from the first plane, and second portions of groove 208b in contact with body 208a. As such, stiffener 208 comprising body 208a and groove 208b is formed from a continuous stiffener material. In exemplary implementations, an overall horizontal area of the continuous stiffener material lies within or does not extend beyond a horizontal surface area of substrate 202 as shown.

If Aluminum or Copper is used as stiffener materials, for example, groove 208b may be forged by a process of stamping. In the case of a ceramic stiffener material, groove 208b can be forged by a process of sintering. The size of the hollow portion of groove 208b formed within the top and side portions (or, more generally, first and second portions), can be adjusted based on components which will be housed within the hollow portion.

Figure 2B:
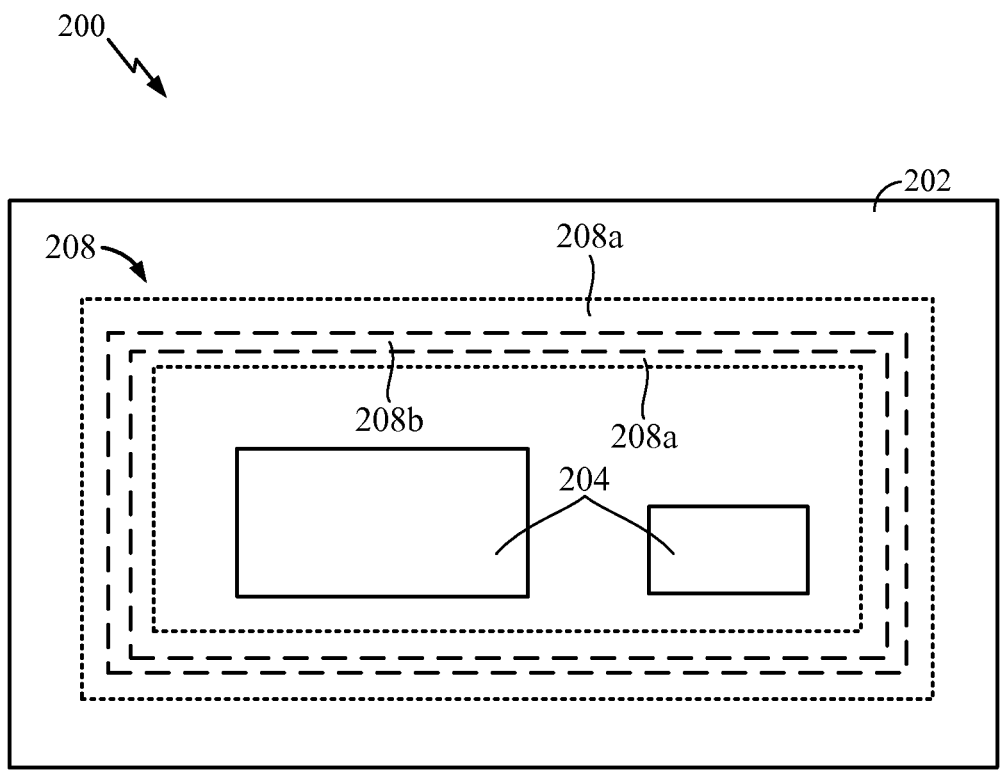

With reference to FIG. 2B, a schematic top view of stiffener 208 is illustrated, for an exemplary package 200. As shown in this view, stiffener 208 can take the shape of an outer ring along the perimeter of substrate 202, on the outside of one or more dies, collectively referred to herein, as die 204. Stiffener 208 may be attached to substrate 202 by a process of ACF or ACP. More specifically, body 208a of stiffener 208 is attached to the substrate, and groove 208b is raised from the plane of body 208a and in the top view, groove 208b can be shaped as a concentric ring or strip within the boundaries of body 208a. While rectangular shapes are depicted for body 208a and groove 208b of stiffener 208, this is not to be viewed as a restriction, and any suitable shape is possible within the scope of this disclosure. Moreover, for the sake of simplicity, only one groove is shown and described in the embodiment, but it will be understood that any number of grooves can be formed within stiffener 208 in like manner. Moreover, there is no requirement that groove 208b form a continuous strip of uniform dimensions. For example, it is possible to have exemplary groove formations which are disjoint, for example, in the shape of a plurality of disjoint strips, which may have hollow or housing portions of different and non-uniform dimensions, as long as the entirety of stiffener 208 is formed from a continuous material, with recesses set in for the plurality of grooves.

Once the exemplary stiffener structures with the recessed grooves are fabricated, they may undergo additional processes prior to attachment to the substrate. For example, a passivation layer may be added within the housing of the groove, or in other words, to a bottom surface (or more generally, a second surface) of the groove, prior to formation of passive components such as high density capacitors. Leads to wire connections such as a power line and a ground connection may be formed at predetermined locations in order to support a predetermined PDN layout on the substrate. Some exemplary process steps related to these features will now be discussed.

Figure 3A:
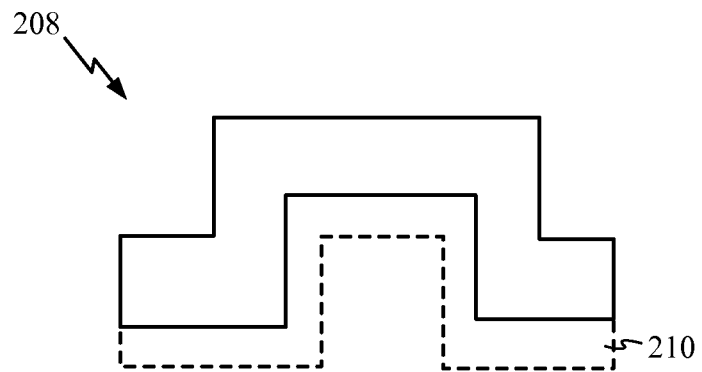
FIGS. 3A-E depict side views of exemplary components and processes related formation of an exemplary stiffener structure with a recessed groove.

With reference now to FIGS. 3A-E, side views of related to an exemplary formation process and related components for package 200 are illustrated. Firstly, stiffener 208 is formed, for example, as described with respect to FIG. 2A (i.e. with body 208a and groove 208b, formed, for example, via stamping or forging for metal stiffener material or sintering for ceramic stiffener material). In FIG. 3A, passivation layer 210 is formed by a process of passivation of the bottom surfaces (or more generally, second surfaces) of body 208a and groove 208b. It will be noted that the formation of passivation layer 210 is optional, in that, if stiffener 208 formed of ceramic, no passivation is required. In the case of a metal, such as, Aluminum or Copper used in the formation of stiffener 208, passivation layer 210 is formed through a process of anodizing the metal used in the formation of stiffener 208.

Figure 3B:
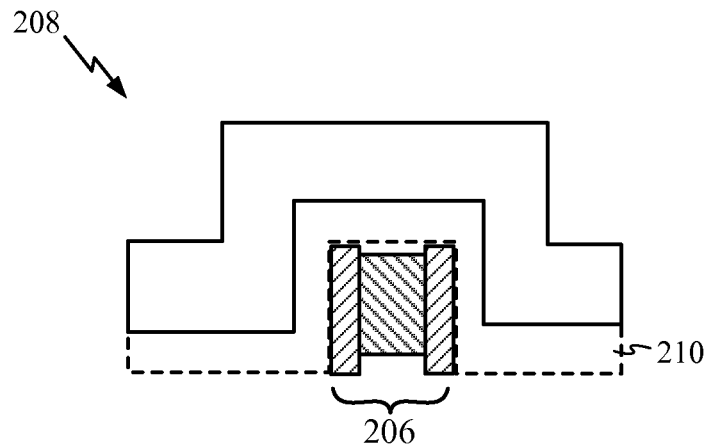

Coming to FIG. 3B, a high density capacitor 206 (or simply, "cap 206" hereafter) is embedded or housed within groove 208b. If passivation layer 210 is present, then cap 206 is formed underneath passivation layer 210 within groove 208b. Cap 206 can be a conventional capacitor, depicted with two side walls and a dielectric in between. While cap 206 is illustrated, any other passive component, such as, an inductor can be formed in a similar manner within groove 208b. Moreover, while only one capacitor is illustrated, a plurality of capacitors in the form of a capacitor bank may be formed in its place, which enhances area utilization. Once cap 206 is embedded, the structure of FIG. 3B addition of adhesive and curing is performed. In some embodiments, it is also possible to mount the passive components on substrate 202, for example, using SMT, and then providing stiffener 208 with the recessed groove 208b as a housing over the passive component.

Figure 3C:
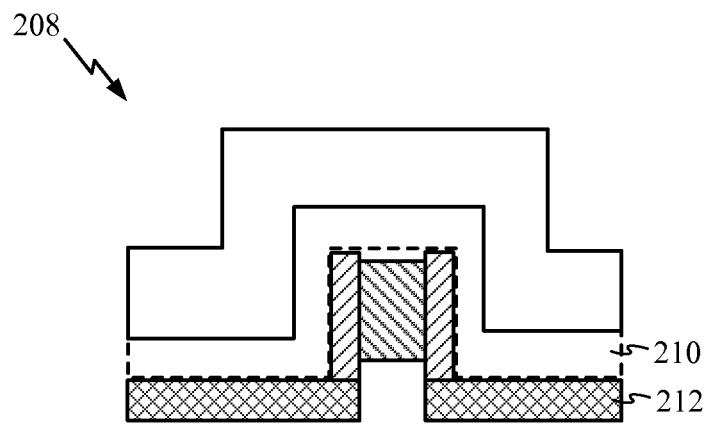

In FIG. 3C, adhesive layer 212 is shown. Adhesive layer 212 can be formed by a process of anisotropic conductive film (ACF) lamination or anisotropic conductive paste (ACP) deposition.

Figure 3D:
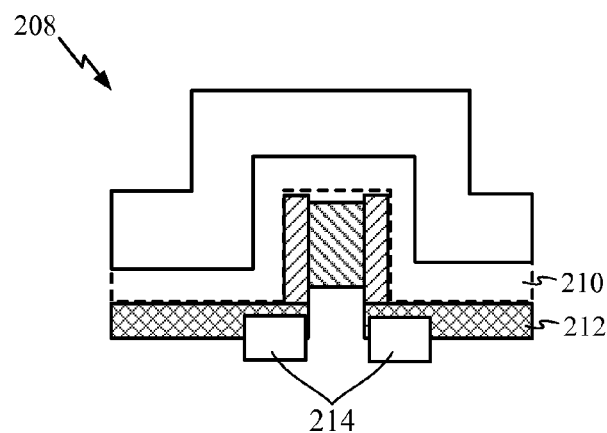

Referring to FIG. 3D, leads 214 are attached to provide connections to cap 206. Stiffener 208 is ready to be attached to substrate 202.

Figure 3E:
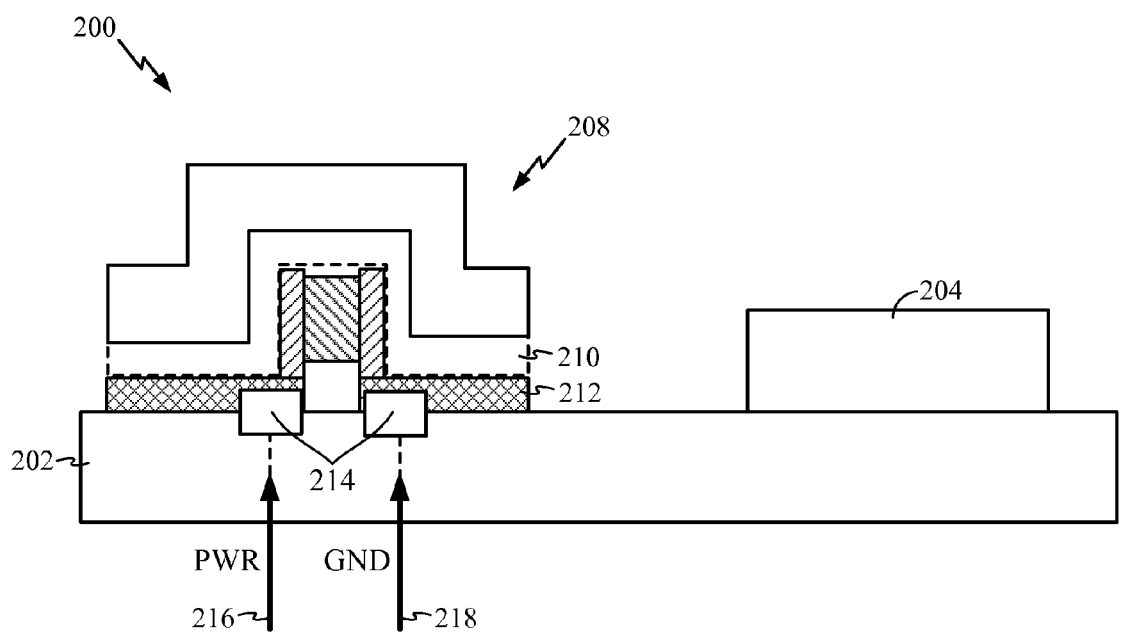
Figure 4:
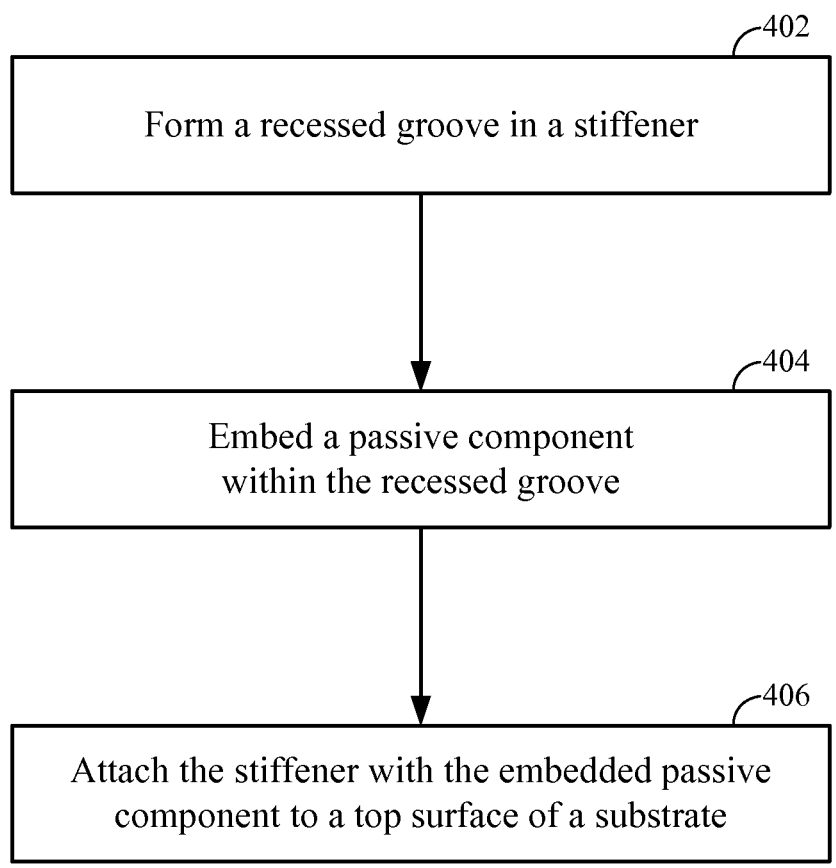
FIG. 4 illustrates a flow chart of sequences in the formation of an exemplary semiconductor package using an exemplary stiffener.

With reference to FIG. 3E, stiffener 208 along with cap 206 is attached to substrate 202 and cured. Power line 216 and ground connection 218 may be derived based on a predetermined placement of such connections according to a corresponding PDN design, and can be correspondingly connected to leads 214. The attachment of die 204 is not discussed in detail, as such details are not germane to this disclosure. As such, die 204 may be attached to substrate 202 based on any known process which can include wire bonds or flip chip technology. Once again, while a single die is depicted, a plurality of semiconductor dies may be formed, with the stiffener material forming an outer ring around the plurality of dies (e.g., as shown in FIG. 2B).

The above embodiments related to formation and attachment of stiffener 208 with recessed groove 208b comprising embedded passives, such as cap 206 may be compatible with any known package technology. For example, stiffener 208 may be formed on an FcBGA package discussed above. Moreover, exemplary processes are compatible with interposers which may be provided on some substrates. The contact area or coverage of stiffener 208 on substrate 202 may be designed based on overall size requirements of the package. Since horizontal area of exemplary stiffener structures are contained within boundaries of the top surface (or more generally, a first surface) of the substrate, or in other words, the stiffener structures do not protrude beyond the horizontal boundaries of the substrate, as shown in the various illustrations, the exemplary stiffeners do not contribute to an increase in package dimensions, unlike conventional stiffener 108 of FIG. 1, for example. Moreover, exemplary stiffeners also avoid holes or breaks in continuity of the stiffener material by providing the recessed grooves, which enhances their stability and desirable characteristics to prevent warpage. Since the passive components, and for that matter, any other suitable circuit element or package component can be housed within the groove, they do not need to be placed or mounted on a section of the substrate's surface which is not covered by the stiffener. This allows for the design of smaller substrates, and thus smaller package sizes.

It will be appreciated that embodiments include various methods for performing the processes, functions and/or algorithms disclosed herein. For example, as illustrated in FIG. 5, an embodiment can include a method of forming a stiffener (e.g., 208) for a semiconductor package (e.g., 200), the method comprising: forming a recessed groove (e.g., 208b) in a stiffener—Block 402; embedding a passive component (e.g., 206) within the recessed groove—Block 404; and attaching the stiffener with the embedded passive component to a first surface of a substrate (200)—Block 406.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for forming a stiffener with a recessed groove in a semiconductor package. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of forming a stiffener for a semiconductor package, the method comprising:
   forming a recessed groove in a stiffener;
   embedding a passive component within the recessed groove;
   attaching the stiffener with the embedded passive component to a first surface of a substrate; and
   forming leads in the passive component and connecting the leads to a power line and a ground connection derived from a predetermined power distribution network (PDN) layout on the substrate.

2. The method of claim 1, further comprising forming a passivation layer on a surface of the recessed groove which interfaces the first surface of the substrate.

3. The method of claim 1, wherein the passive component is a high density capacitor.

4. The method of claim 1, wherein the stiffener is attached to the first surface of the substrate using anisotropic conductive film (ACF) or anisotropic conductive paste (ACP).

5. The method of claim 1, wherein the stiffener is made of Aluminum or Copper and the recessed groove is formed by a process of stamping.

6. The method of claim 1, wherein the stiffener is made of ceramic and the recessed groove is formed by a process of sintering.

7. The method of claim 1, wherein a body portion of the stiffener outside the recessed groove, and the recessed groove, are formed from a continuous material.

8. The method of claim 1, further comprising, forming a semiconductor die on the first surface of the substrate, wherein the stiffener is shaped as an outer ring around the semiconductor die on the first surface of the substrate.

9. The method of claim 1, wherein the stiffener is configured to protect the semiconductor package from warpage.

10. The method of claim 1, wherein a horizontal area of the stiffener is contained within horizontal boundaries of the first surface of the substrate.

11. A semiconductor package comprising:
    a substrate;
    a stiffener attached to a first surface of the substrate, wherein the stiffener comprises a recessed groove;
    a passive component embedded within the recessed groove; and
    leads coupled to the passive component, wherein the leads are connected to a power line and a ground connection derived from a predetermined power distribution network (PDN) layout on the substrate.

12. The semiconductor package of claim 11, further comprising a passivation layer on a surface of the recessed groove which interfaces the first surface of the substrate.

13. The semiconductor package of claim 11, wherein the passive component is a high density capacitor.

14. The semiconductor package of claim 11, wherein the stiffener is attached to the first surface of the substrate using anisotropic conductive film (ACF) or anisotropic conductive paste (ACP).

15. The semiconductor package of claim 11, wherein the stiffener is made of Aluminum or Copper and the recessed groove is formed by a process of stamping.

16. The semiconductor package of claim 11, wherein the stiffener is made of ceramic and the recessed groove is formed by a process of sintering.

17. The semiconductor package of claim 11, wherein a body portion of the stiffener outside the recessed groove, and the recessed groove, are formed from a continuous material.

18. The semiconductor package of claim 11, further comprising, a semiconductor die formed on the first surface of the substrate, wherein the stiffener is shaped as an outer ring around the semiconductor die on the first surface of the substrate.

19. The semiconductor package of claim 11, wherein the stiffener is configured to protect the semiconductor package from warpage.

20. The semiconductor package of claim 11, wherein a horizontal area of the stiffener is contained within horizontal boundaries of the first surface of the substrate.

21. A semiconductor package system comprising:
    a substrate;
    a stiffener attached to a first surface of the substrate, the stiffener comprising a means for receiving;
    a passive component embedded within the means for receiving; and
    leads coupled to the passive component, wherein the leads are connected to a power line and a ground connection derived from a predetermined power distribution network (PDN) layout on the substrate.

22. The semiconductor package system of claim 21, wherein a body portion of the stiffener outside the means for receiving, and the means for receiving, are formed from a continuous material.

* * * * *